United States Patent
Lo et al.

(10) Patent No.: US 11,741,362 B2
(45) Date of Patent: Aug. 29, 2023

(54) TRAINING NEURAL NETWORKS USING MIXED PRECISION COMPUTATIONS

(71) Applicant: Microsoft Technology Licensing, LLC, Redmond, WA (US)

(72) Inventors: Daniel Lo, Bothell, WA (US); Eric Sen Chung, Woodinville, WA (US); Bita Darvish Rouhani, La Jolla, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1257 days.

(21) Appl. No.: 15/974,637

(22) Filed: May 8, 2018

(65) Prior Publication Data

US 2019/0347553 A1 Nov. 14, 2019

(51) Int. Cl.
| | |
|---|---|
| *G06N 3/08* | (2023.01) |
| *G06N 3/084* | (2023.01) |
| *G06F 7/544* | (2006.01) |
| *G06N 3/082* | (2023.01) |
| *H03M 7/24* | (2006.01) |
| *G06F 18/214* | (2023.01) |

(52) U.S. Cl.
CPC ........... *G06N 3/084* (2013.01); *G06F 7/5443* (2013.01); *G06F 18/214* (2023.01); *G06N 3/082* (2013.01); *H03M 7/24* (2013.01)

(58) Field of Classification Search
CPC ... G06F 7/5443; G06F 18/214; G06K 9/6256; G06N 3/063; G06N 3/082; G06N 3/084; H03M 7/24
See application file for complete search history.

(56) References Cited

U.S. PATENT DOCUMENTS

| | | | | |
|---|---|---|---|---|
| 2013/0212053 | A1* | 8/2013 | Yagi | G06V 10/454 706/31 |
| 2018/0322607 | A1* | 11/2018 | Mellempudi | G06F 5/01 |
| 2019/0122105 | A1* | 4/2019 | Boybat Kara | G06N 3/063 |
| 2019/0138922 | A1* | 5/2019 | Liu | G06N 3/0481 |
| 2019/0155575 | A1* | 5/2019 | Langhammer | G06N 3/0445 |
| 2019/0205746 | A1* | 7/2019 | Nurvitadhi | G06N 3/0454 |

OTHER PUBLICATIONS

Narang et al., "Mixed Precision Training", Feb. 15, 2018, ICLR 2018, pp. 1-12 (Year: 2018).*

(Continued)

*Primary Examiner* — Brent Johnston Hoover
(74) *Attorney, Agent, or Firm* — Barta, Jones & Foley, PLLC (57) ABSTRACT

A system for training a neural network receives training data and performing lower precision format training calculations using lower precision format data at one or more training phases. One or more results from the lower precision format training calculations are converted to higher precision format data, and higher precision format training calculations are performed using the higher precision format data at one or more additional training phases. The neural network is modified using the results from the one or more additional training phases. The mixed precision format training calculations train the neural network more efficiently, while maintaining an overall accuracy.

20 Claims, 7 Drawing Sheets

(56) References Cited

OTHER PUBLICATIONS

Das et al., "Mixed Precision Training of Convolutional Neural Networks Using Integer Operations", Feb. 23, 2018, ICLR 2018, pp. 1-11 (Year: 2018).*
Kim et al., "A Highly Scalable Restricted Boltzmann Machine FPGA Implementation", Sep. 2, 2009, 2009 International Conference on Field Programmable Logic and Applications, pp. 367-372 (Year: 2009).*
Svyatkovskiy et al., "Training distributed deep recurrent neural networks with mixed precision on GPU clusters", Nov. 17, 2017, MLHPC'17, pp. 1-8 (Year: 2017).*
Chung, et al., "Hardware Node Having a Matrix Vector Unit with Block-Floating Point Processing," Application as Filed in U.S. Appl. No. 15/680,649, filed Aug. 18, 2017, 45 Pages.
Köster, et al., "Flexpoint: An Adaptive Numerical Format for Efficient Training of Deep Neural Networks," In Proceedings of 31st Conference on Neural Information Processing Systems, Long Beach, CA, 2017, 11 pages.
Courbariaux, et al., "Training Deep Neural Networks with Low Precision Multiplications", Retrieved From: https://arxiv.org/abs/1412.7024 vol. 1412.7024, No. v5 Sep. 23, 2015, 10 Pages.
Drumond, et al., "End-to-End DNN Training with Block Floating Point Arithmetic", In Journal of the Computing Research Repository, Apr. 4, 2018, 09 Pages.
Micikevicius, et al., "Mixed Precision Training", Retrieved From: https://arxiv.org/pdf/1710.03740.pdf, Feb. 15, 2018, 12 Pages.
"International Search Report and Written Opinion Issued in PCT Application No. PCT/US2019/029525", dated Jul. 31, 2019, 12 Pages.

* cited by examiner

TRAINING NEURAL NETWORKS USING MIXED PRECISION COMPUTATIONS

BACKGROUND

Neural networks are increasingly used in many application domains for tasks such as computer vision, robotics, speech recognition, medical image processing, computer games, augmented reality, virtual reality and others. For example, neural networks are increasingly used for classification and regression tasks for object recognition, lip reading, speech recognition, detecting anomalous transactions, text prediction, and many others. Typically, the quality of performance of the neural network depends on how well the network has been trained and the amount of training data available.

A neural network is a collection of layers of nodes interconnected by edges and where weights which are learned during a training phase are associated with the nodes. Input features are applied to one or more input nodes of the network and propagate through the network in a manner influenced by the weights (the output of a node is related to the weighted sum of the inputs). As a result, activations at one or more output nodes of the network are obtained.

The training process for neural networks generally involves using a training algorithm to update parameters of the neural network in an iterative process. The training involves computations performed at different phases or stages. In some existing systems, training processes perform higher precision computations at all the different phases or stages. This results in a time consuming and computationally intensive training process, particularly when performing higher complexity mathematical operations, such as dot product calculations.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A computerized method for training a neural network comprises receiving training data and performing lower precision format training calculations using lower precision format data at one or more training phases. The method further comprises converting one or more results from the lower precision format training calculations to higher precision format data, and performing higher precision format training calculations using the higher precision format data at one or more additional training phases. The method also includes modifying the neural network using the results from the one or more additional training phases.

Many of the attendant features will be more readily appreciated as the same becomes better understood by reference to the following detailed description considered in connection with the accompanying drawings.

BRIEF DESCRIPTION OF THE DRAWINGS

The present description will be better understood from the following detailed description read in light of the accompanying drawings, wherein.

Corresponding reference characters indicate corresponding parts throughout the drawings. In the figures, the systems are illustrated as schematic drawings. The drawings may not be to scale.

DETAILED DESCRIPTION

The computing devices and methods described herein are configured to train a neural network with computations using different numerical precision at different phases or stages of the training. For example, while forward pass values and gradients are calculated with a lower precision, a weight accumulation is performed at a higher precision in order to smoothly improve the neural network accuracy. This mixed-precision dot product engine enables lower precision multiplication to be combined with higher precision accumulation. As a result, processing time and processing resources needed for training the neural network are reduced.

A mixed or hybrid precision computation process in some examples performs calculations in different format precisions to allow increased processing speeds at phases or stages that can be performed using lower precisions, while performing calculations at higher precisions at phases or stages that have a greater impact on the training process. For example, a mixed precision system in some examples uses both block floating point and single-precision floating point formats at different stages of the neural network training process. Switching between lower precision and higher precision formats (e.g., by converting between block floating point and 32-bit floating point formats, or other non-block floating point formats) allows for an optimized process that balances computational accuracy and speed of processing. As a result, a more efficient training of the neural network can be performed. In this manner, when a processor is programmed to perform the operations described herein, the processor is used in an unconventional way, and allows the more efficient training of the neural network.

Figure 1:
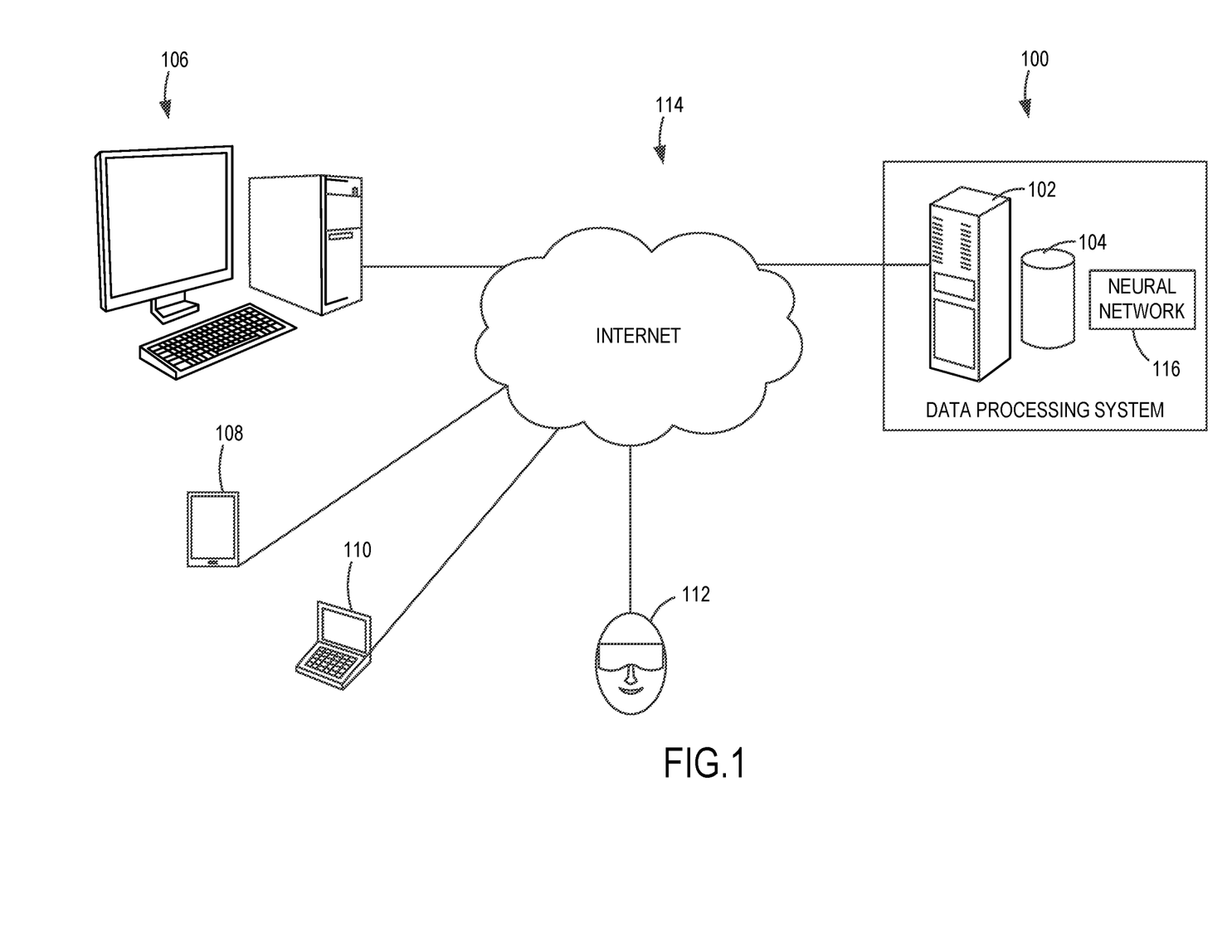
FIG. 1 is an exemplary block diagram illustrating a data processing system according to an embodiment.

FIG. 1 is a schematic block diagram of a data processing system 100 (e.g., an image processing system) deployed as a cloud service in this example. The data processing system 100 includes one or more computers 102 and storage 104 to store neural network data, including training data (e.g., polygon data meshes or numerical training values) in some examples. It should be appreciated that other data, such as neural network inference data, or other non-neural network data can be stored in the storage 104 and processed by the one or more computers 102 using the present disclosure.

The data processing system 100 is connected to one or more end user computing devices in some examples, such as a desktop computer 106, a smart phone 108, a laptop computer 110 and an augmented reality head worn computer 112 (e.g., Microsoft HoloLens®). For example, the data processing system 100 is shown as connected to the end user computing devices via a computer network 114, illustrated as the Internet.

The data processing system 100 receives input data, such as neural network training data from an end user computing device or server. The data is uploaded to the data processing system 100. It should be appreciated that some or all of the data processing system 100 or the functionality of the data processing system 100 can be implemented within the end user computing device.

The data processing system 100 implements a neural network 116 trained according to the present disclosure using a mixed precision training engine. When the neural network 116 is trained, a large amount of data (e.g., three-dimensional (3D) objects) can be processed and stored in a database, such as in the storage 104. In some examples, the functionality of the data processing system 100 described herein is performed, at least in part, by one or more hardware logic components. For example, and without limitation, illustrative types of hardware logic components that are used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), Graphics Processing Units (GPUs).

Figure 2:
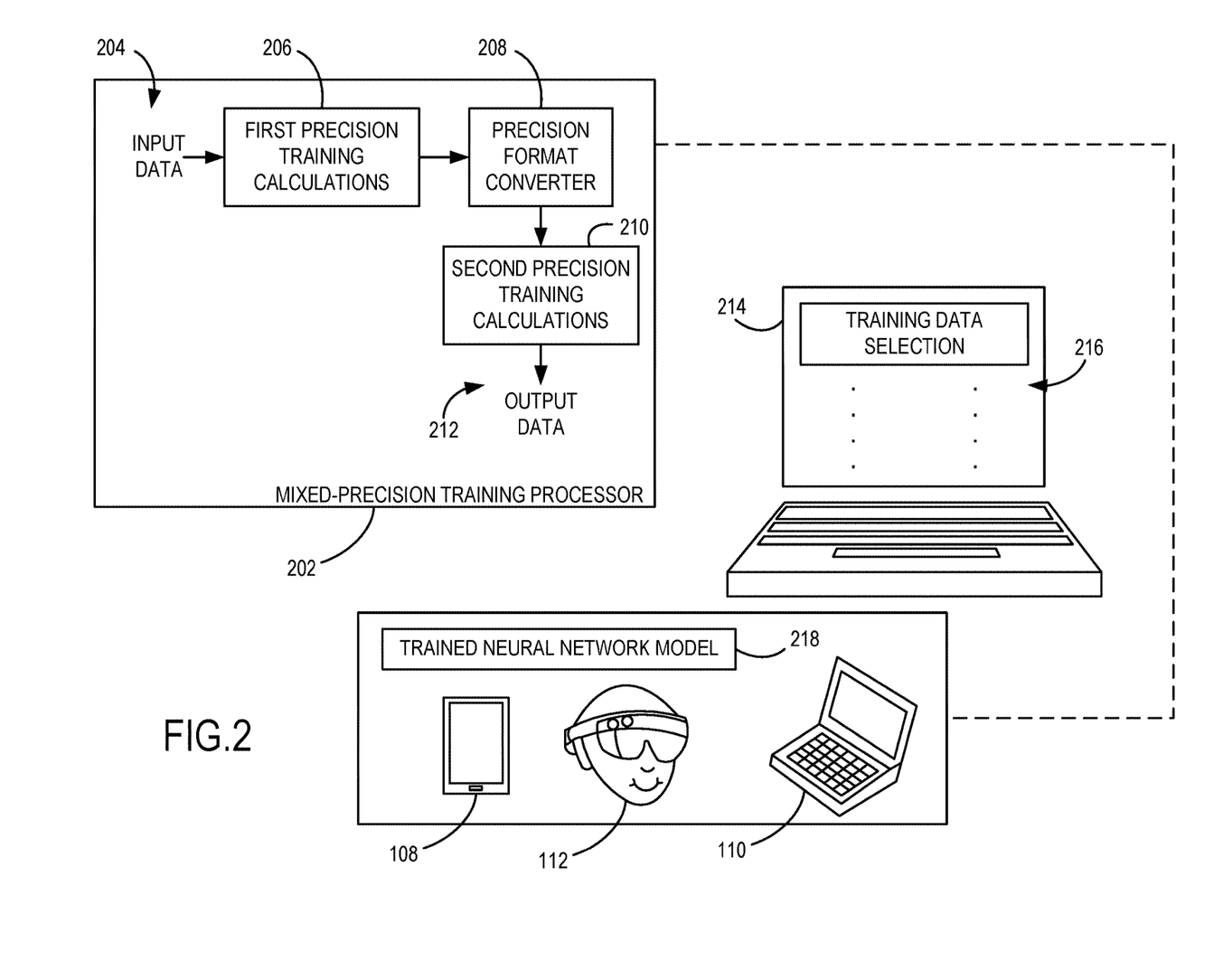
FIG. 2 is an exemplary schematic block diagram of a neural network training system according to an embodiment.

Various examples include a neural network training system 200 as illustrated in FIG. 2. The neural network training system 200 in one example uses back propagation and/or other training techniques as described herein. The neural network training system 200 includes a mixed-precision training processor 202 that is configured in some examples as a mixed-precision computation engine that uses different computation precision formats at different phases or stages of the training process.

The mixed-precision training processor 202 has access to input data 204, such as training data for neural network training. In one example, the neural network training is performed using calculations having different precisions at various phases or stages of the training process as will be described in more detail herein. In the illustrated example, the input data 204 is processed using first precision training calculations 206 in one phase or stage of the neural network training. For example, forward pass and back propagation calculations are performed using a first precision and these calculations are part of dot product calculations used for the neural network training. The first precision training calculations 206 generate an output (e.g., an intermediate output) that is precision format converted by a precision format converter 208. In some examples, an integer gradient value calculated in the back propagation phase or stage using the first precision training calculations 206 is converted to a floating point value (e.g., 32-bit value) before performing additional training operations at a different phase or stage of the training process (e.g., before performing the updating of the weights).

The precision converted output is then processed using second precision training calculations 210, wherein the first precision is less than the second precision. For example, calculations to update weights in the neural network are performed using the second precision as part of the neural network training. Output data 212 is then generated as a final output, which in some examples are updated weights for the neural network. For example, the neural network is modified (trained) using the updated weights.

Thus, in some examples, the mixed-precision training processor 202 is configured to perform calculations at the first precision using block floating point values (e.g., integer values) and the calculations at the second precision using single-precision floating point values (e.g., 32-bit values). As described in more detail herein, during the neural network training process, in various examples, multiplication is performed at the first precision and accumulation is performed at the second precision.

A large training set of data (e.g., 3D objects) is used in various examples to train the neural network. As a result of the mixed precision calculations performed in accordance with the present disclosure, at least some of the calculations performed during the training process are simplified, thereby increasing the speed at which the training is performed.

In one example, back propagation (also referred to as a back propagation of errors) is used to train the neural network in combination with an optimization method, such as gradient descent. In some examples, the process includes a two-phase cycle (or propagation and a weight update). For example, a back-propagation algorithm comprises inputting a labeled training data instance to the neural network, propagating the training instance through the neural network (referred to as forward propagation or a forward pass) and observing the output. The training data instance is labeled such that the ground truth output of the neural network is known. The difference or error between the observed output and the ground truth output is found and provides information about a loss function, which is passed back through the neural network layers in a back propagation or back pass.

A search is made to try find a minimum of the loss function, which is a set of weights of the neural network that enable the output of the neural network to match the ground truth data. Searching the loss function is achieved using gradient descent or stochastic gradient descent or in other ways, and as part of this process gradients are computed. The gradient data is used to update weights of the neural network. In various embodiments, the computations performed during the forward pass and back propagation are less precise than the computations performed during the computations that result in the updated weights. For example, the forward pass and back propagation calculations using a first precision and are part of dot product calculations are performed at a lower precision and the calculations used to calculate the updated weights are performed at a higher precision. That is, in some examples, a lower bit precision format is used for the calculations performed for the forward pass and back propagation than used for the calculations to determine the updated weights.

In one example, the mixed-precision training processor 202 has details of the neural network topology (such as the number of layers, the types of layers, how the layers are connected, the number of nodes in each layer, the type of neural network), which can be specified by an operator. For example, an operator is able to specify the neural network topology using a graphical user interface 214. When the neural network is trained, a large amount of 3D objects can be processed and stored in a database. For example, the database can include identifiers corresponding to thousands of 3D objects in an image processing application.

In some examples, the operator is able to select a tuning parameter of the mixed-precision neural network training system 200 using a parameter selector interface 216 or other selection means that allows the user to select or define different calculation parameters as part of training data selection. In one example, the tuning parameter controls the precision of calculations performed by the first precision training calculations 206 and the second precision training calculations 210, such as the relative bit format precision for the calculations performed. Once the operator has configured one or more tuning parameters, or in some cases, using a predefined set of tuning parameters (that can be automatically selected), the mixed-precision training processor 202 is configured to perform neural network training computations to train the neural network using neural network training processes in the neural network technology.

In one example, once the training of the neural network is complete (for example, after the training data is exhausted) a trained neural network model 218 (topology and parameter values) is stored and loaded to one or more end user devices such as the smart phone 108, the wearable augmented reality computing device 112, the laptop computer 110 or other end user computing device. The end user computing device is able to use the trained neural network model 218 to carry out the task for which the neural network has been trained. For example, in the case of the wearable augmented reality computing device 112, an engine is opened to recognize assets being looked at by the wearer of the wearable augmented reality computing device 112 and the trained neural network model 218 is used to understand how the assets are oriented, whether the asset is opened, etc.

Figure 3:
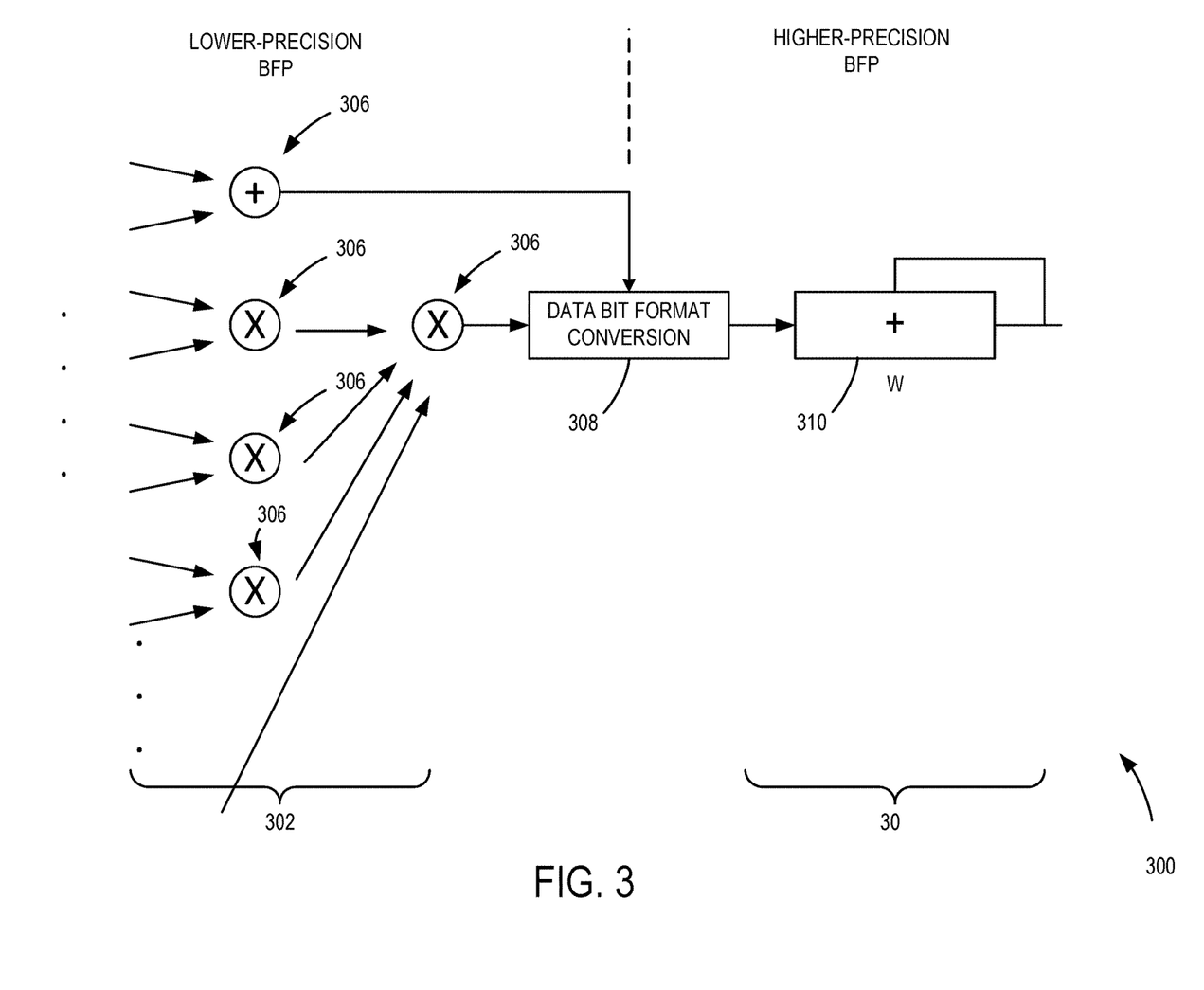
FIG. 3 illustrates training calculations according to an embodiment.

FIG. 3 illustrates a mixed-precision computation process 300 in one example that is used to train the neural network. The mixed-precision computation process 300 represents graphically the computations performed during the forward and back propagation process and weight updating in the neural network training. In one example, the neural training process includes performing the following calculations (also referred to as computations):

$y_0 = \sigma(x_0 W + b)$—forward pass  Eq. 1

$L = f(y_0^* - y_0)$—loss calculation, where $f$ is a loss function  Eq. 2

$\nabla W = dL/dW$—back propagation to calculate gradients  Eq. 3

$W_{\{t+1\}} = W_t + \eta \cdot \nabla W$—weight update  Eq. 4

In the above equations, W is a weight, b is a bias term, $\sigma$ represents non-linearity, $x_0$ is the input, $y_0^*$ is the expected output, and $\eta$ is a learning rate. The difference of $y_0^*$ and $y_0$ (i.e., $y_0^* - y_0$) is back propagated to train the neural network to calculate the weight updates. It should be noted that while the above-described equations generally correspond to a one-layer network, the present disclosure can be implemented in connection with different types of networks having multiple layers.

In various examples, during neural training, which includes performing Eqs. 1-4, the calculations performed as part of Eqs. 1-3, which include dot product computations (e.g., $x_0 W$ is a matrix vector multiply operation wherein dot products are computed for each row of the matrix) are performed using a lower bit precision (e.g., block floating point precision format) and the computations performed as part of Eq. 4 that include accumulation operations, are performed using a higher bit precision (e.g., single-precision floating point format). For example, the dot product operations performed as part of the $\eta \cdot \nabla W$ are computations performed using a block floating point format, whereas the accumulation operations for the weight update are performed using a higher precision format, such as a single-precision floating point format. In various examples, the dot product operations compute a scalar product of two vectors, such as $a = [a_1, a_2, \ldots a_n]$ and $b = [b_1, b_2, \ldots, b_n]$ as follows:

$a \cdot b = \Sigma_{i=1}^n a_i b_i = a_1 b_1 + a_2 b_2 + \ldots + a_n b_n$  Eq. 5

In Eq. 5, $\Sigma$ denotes the summation and n is the dimension of the vector space. In operation, a row vector is multiplied by a column vector. In general, a matrix is a rectangular array of numbers, symbols, or expressions that are arranged in rows and columns, and individual items in a matrix are commonly referred to as elements or entries. Matrices are often used to represent linear transformations, that is, generalizations of linear functions such as f(x)=ax. As such, matrices can be used, for example, to project 3D images onto a two-dimensional (2D) screen or to perform calculations used to create realistic-seeming motion, among many other applications. It should be noted that the present disclosure can be applied to different matrices, such as a sparse matrix that is a matrix populated primarily with zeros, or a dense matrix that is a matrix where a significant number of elements (e.g. a majority) are not zeros. Sparse matrices are useful in various application areas such as, for example, network theory where it is common to have a low density of significant data or connections represented by non-zero values interspersed throughout a far greater number of zero values. It should further be noted that the present disclosure can be implemented in connection with different types of matrices and is not limited to the matrices described herein. For example, the operations described herein can be performed in combination with different sparse matrix formats, such as a coordinate format, a compressed space row format, or other formats, such as a diagonal sparse matrix format or a bit-vector format.

With particular reference to FIG. 3, some operations 302 are performed at a lower precision format (e.g., block floating point) and other operations 304 are performed at a higher precision format (e.g., single-precision floating point format). Specifically, in the illustrated embodiment, dot product calculations 306 performed on the exponent ($e_0$, $e_1$, ...) and mantissa ($m_0$, ...) portions of the input data values, or a combination thereof, are performed using a lower precision bit format, such as block floating point format. The output from these calculations are converted using a data bit format conversion 308, which in the illustrated embodiment is a conversion from an integer format (block floating point) to a single-precision floating point format. In some examples, the single-precision floating point format is defined by the float being stored as 32 bits, where the sign is 1 bit, the exponent is eight bits, and the significand is 32 bits. However, as should be appreciated, the initial and final bit precision formats can be varied as desired or needed, for example, based on the overall accuracy or speed requirements for the training process. In some examples, the higher precision format is a format having at least sixteen bits and the lower precision format is a format having less than sixteen bits. In other examples, the higher precision format is a format having thirty-two bits and the lower precision format is a format having eight bits. However, as should be appreciated, in accordance with the present disclosure, various examples generally include a higher precision format that is one that has more bits than a lower precision format, wherein the number of bits can be other values.

The converted data values, output in the higher bit precision format are then accumulated in one or more accumulation operations 310. Thus, after $\eta \cdot \nabla$ is computed in a lower precision format (e.g., a lower bit precision format), the results are converted to a higher precision format (e.g., a higher bit precision format) before being added back to the weight function (W). In one example, the higher precision format computations are performed in dedicated or specialized hardware, such as a digital signal processor (DSP) block forming part of one or more FPGAs. In some examples, the FPGAs have customizable, reconfigurable processing capabilities for applications in high-performance computing (HPC) that can be configured to perform the various operations of the present disclosure.

Figure 4:
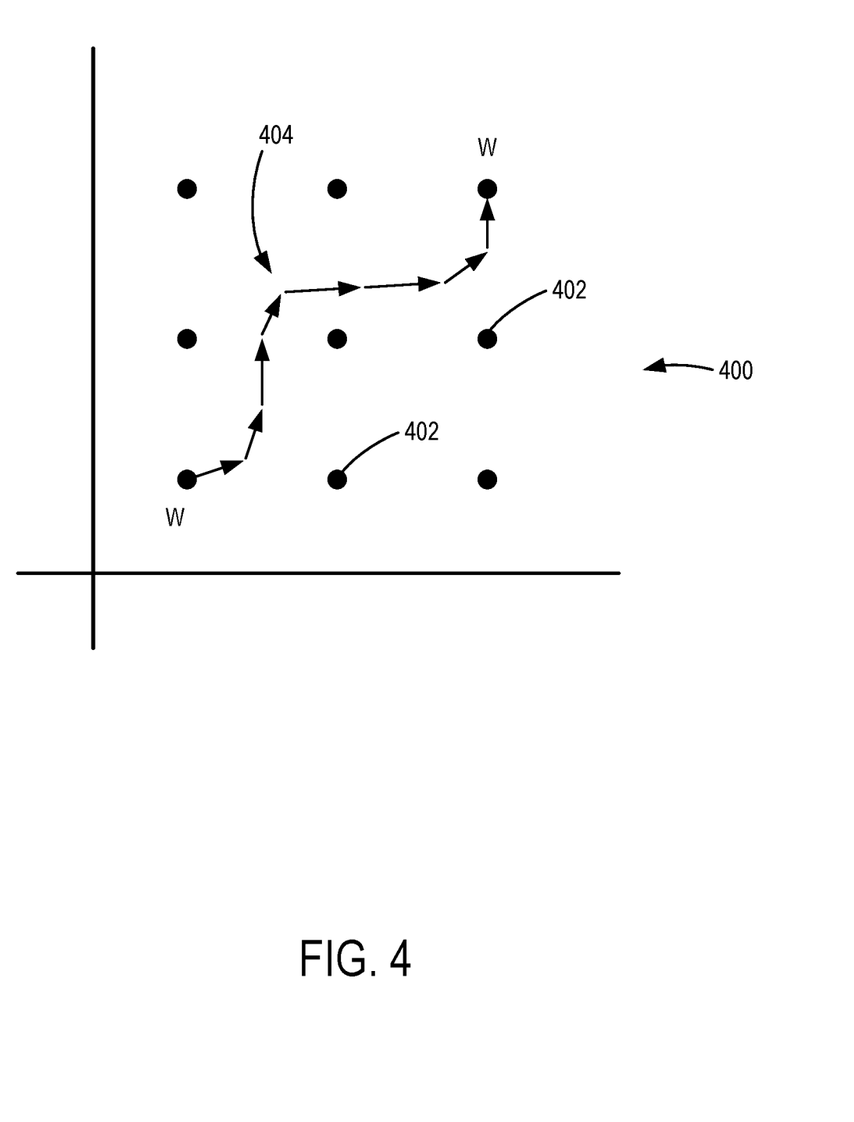
FIG. 4 is an exemplary block diagram of a graph illustrating weight updating according to an embodiment.

The above-described mixed precision computations provide results with improved precision when updating the weights as illustrated in FIG. 4, showing a graph 400 representing the updating of the weights. As can be seen, the updating of the weights is performed at a higher precision, represented by the arrows that follow a path 404 having more precision (higher granularity) than the points 402. That is, the path 404 has smaller "hops" than would be achieved if following a path only along the points 402.

Thus, the present disclosure allows for a mixed or hybrid precision instead of performing all calculations at the same precision format, namely at a higher precision format. In the herein described examples, the numerical precision that can be used at various phases or stages of neural network training can differ. Using mixed precision calculations (e.g., a mixed-precision dot product engine) having different numerical precision allows for a more efficient neural training process (performed faster), such as by enabling lower precision multiplication to be combined with higher precision accumulation.

Figure 5:
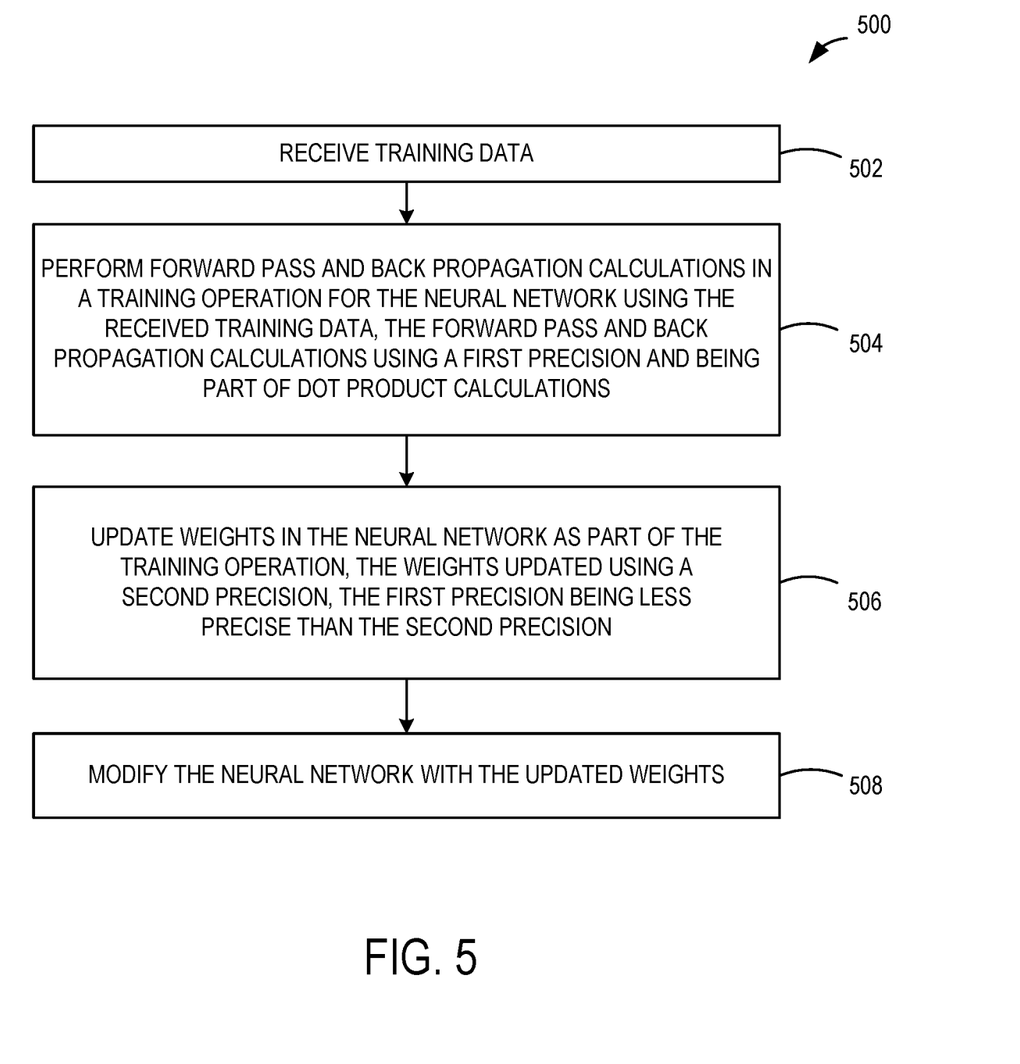
FIG. 5 is an exemplary flow chart illustrating operations of a computing device for neural network training according to various embodiments.
Figure 6:
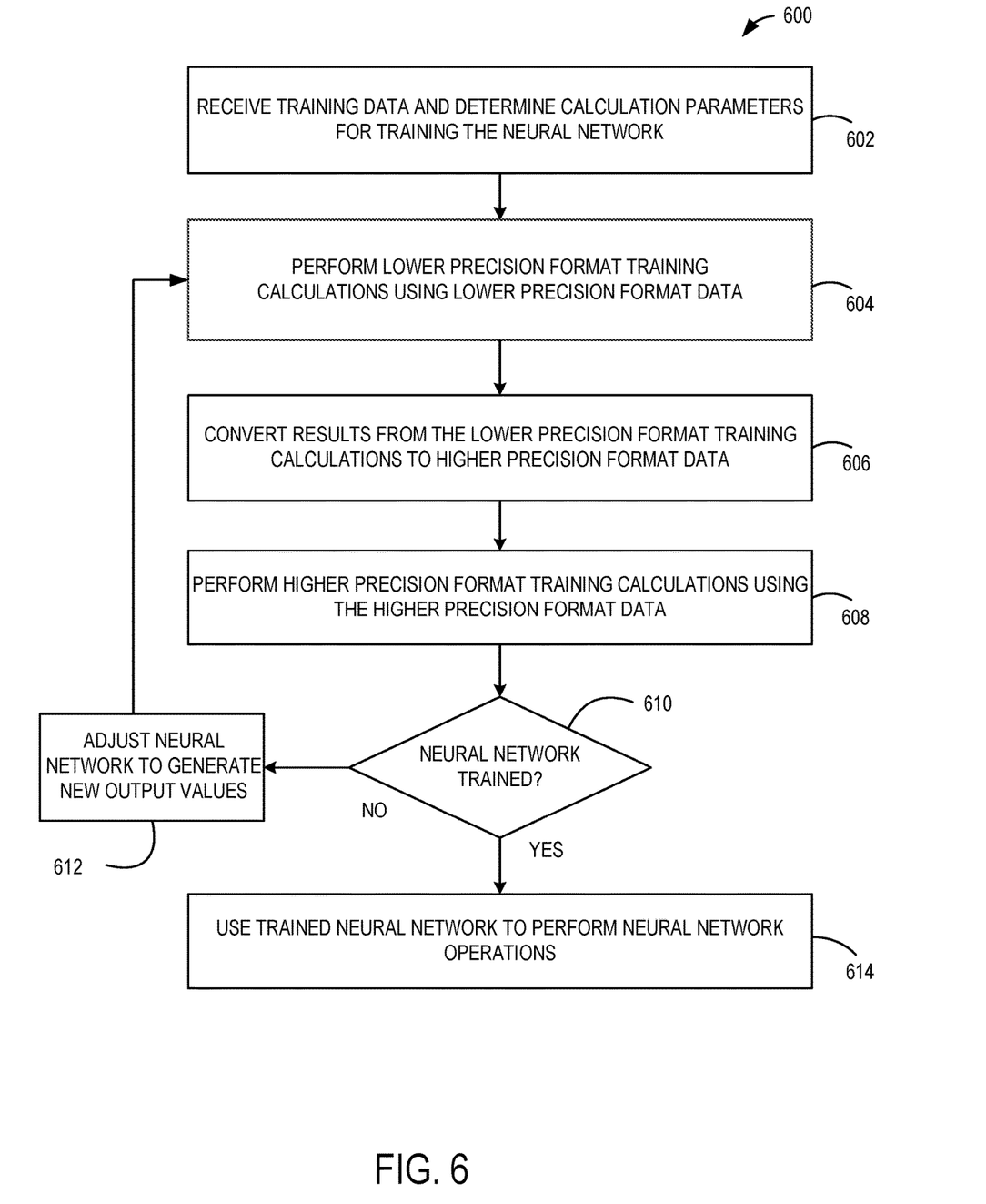
FIG. 6 is another exemplary flow chart illustrating operations of a computing device for neural network training according to various embodiments.

As should be appreciated, the various examples can be used to train different types of neural networks. Additionally, the various examples can be used to perform mixed-precision computations in non-training applications for neural networks and for non-neural applications. The training of neural networks according to various examples of the present disclosure allows for a balance of precision and processing load in making the computations during neural training. FIGS. 5 and 6 illustrate exemplary flow charts of methods 500 and 600 for training a neural network. In particular, these figures are exemplary flow charts illustrating operations of a computing device to train a neural network using mixed-precision formats in computations. The operations illustrated in the flow charts described herein can be performed in a different order than is shown, can include additional or fewer steps and can be modified as desired or needed. Additionally, one or more operations can be performed simultaneously, concurrently or sequentially.

With reference to the method 500, the computing device receives training data at 502. For example, neural network training data can include training data sets for a particular application, such as an image processing application. The training data in some examples includes a plurality of numeric value inputs corresponding to properties or features of the neural network to be trained. The training data is used to generate outputs through an iterative training process, that includes calculations performed using mixed-precision formats as described herein. The training process can be performed using any neural training methods in the neural processing technology. The method 500 can be used for training neural networks, with the trained networks being used, for example, for classification and regression tasks in a wide variety of application domains such as object recognition, lip reading, speech recognition, detecting anomalous transactions, text prediction, and many others.

The training process for the neural network in various examples involves using a training algorithm to update parameters of the neural network in an iterative process. The iterative process can be time consuming and computationally expensive since the number of parameters to be updated is large (in the case of deep neural networks) and the amount of training data is also large. The present disclosure handles the demands of the training process by speeding up the computations performed during the training with mixed-precision computations used at different phases or stages of the training process. In this way, the training time is reduced, while maintaining a desired or required overall training accuracy, and which allows the training to be performed online so that the neural network is available for use anytime and can be continually updated. It should be noted that while the different precisions are described in connection with particular phases or stages of the training process, the relative precisions, as well as the phases or stages having different precisions, can be varied or modified according to the present disclosure.

In various examples, the training is performed on a neural network that is a collection of nodes interconnected by edges and where weights are associated with the nodes and/or edges. A non-linear function is applied in each node to produce the node's activation. The non-linear functions can include, but are not limited to sigmoid, tan h, and rectifier functions. During the training phase, the weights are updated according to update rules in the light of training examples. The units can comprise input units, hidden units and output units. Input units are units at which input is made to the neural network, hidden units are connected between input units and output units (or other hidden units in the case of deep networks), and output units are units at which output from the neural network is observed.

Additionally, the neural network can have a layered configuration with a layer of input nodes, one or more layers of hidden units and at least one output layer. During use of the neural network at test time (i.e. after training) as a signal passes through a layer, the signal produces an output via the activations that becomes the input to the next layer of the neural network and so on, until the signal reaches the output layer and the output units are activated. The pattern of activations at the output layer gives the prediction of the neural network. The pattern of activations is influenced by the weights learned during the training phase or stage.

Referring again to FIG. 5, the method 500 further includes performing at 504 forward pass and back propagation calculations in the training operation for the neural network using the received training data as described herein. The forward pass and back propagation calculations are performed using a first precision (e.g., a first bit format precision) and are performed as part of dot product calculations. For example, the forward pass and back propagation calculations are performed using a lower precision format, such as a block floating point or integer format. As a result of using the lower precision format, processing time is reduced with the reduced complexity in calculations (compared to using a higher precision format at this phase or stage).

The method 500 further includes performing at 506 an updating of weights in the neural network as part of the training operation. The weights are updated using a second precision (e.g., a second bit format precision) that is more precise than the first precision. For example, a weight accumulation process as described herein is performed at a higher bit precision format, such as by converting a lower integer precision format to a floating point format, such as having a 16-bit or 32-bit format (or another bit format). In operation, the converted values are accumulated at a higher precision to generate updated weights for the neural network. Thus, in various examples, a higher precision is used for updating the weights than in other phases or stages of the training process. That is, part of the process is performed in block floating point and another part of the process is performed in single-precision floating point, in some examples. This mixed-precision process (instead of having only one precision) that allows for different numeric formats in the training pipeline defines a hybrid training approach that can be performed with less computational burden. In some examples, a customized hardware design is implemented in accordance with the present disclosure for use with neural networks instead of using GPUs that have new chips added to perform the calculations.

The method 500 includes modifying the neural network with the updated weights at 508. That is, the neural network weights used during neural network operations (e.g., inference operations) are updated, such that the trained neural network model 218 (shown in FIG. 2) is generated in a reduced amount of time.

With reference now to the method 600 illustrated in FIG. 6, at 600, training data is received and calculation parameters for training the neural network are determined. For example, input values (or other data) is received for use in training the neural network. Based on the data, such as the amount of data, type of data and/or the neural network to be trained, and a predefined precision for different phases or stages of the neural training process (which may be adjusted based on a user input), the calculation parameters (e.g., numerical precision) for the various phases or stages in the neural network training process are determined. For example, a determination is made as to the data bit precision format for each of the phases or stages, such as performing calculations at different levels of precision.

The method 600 includes performing lower precision format training calculations in one or more training phases or stages using lower precision format data at 604. For example, in the neural network training process, the forward pass and back projection phases or stages are performed using calculations having a lower bit precision format, such as an integer or block floating point format. As described herein, in some examples, dot product calculations are performed using an integer or block floating point format to generate values that are then used to update the neural network.

In particular, the results from the one or more training phases or stages performed using the lower precision format data are then converted to higher precision format data at 606. For example, the integer or block floating point format from the forward pass and back projection phases or stages are converted to a higher-precision floating point format, such as 32-bit, 16-bit or other bit floating point format that is not an integer or block floating point format.

The converted data, in the higher precision format is then further processed, for example, to perform weight updating in the neural network training process. In particular, higher precision format training calculations are performed at 608, which in some examples, are accumulation calculations as part of the weight updating process. That is, higher precision format training calculations using the higher precision format data are performed. Thus, training phases or stages where higher precision calculations are desirable or needed are performed using higher precision format data, while training phases or stages where lower precision calculations are desirable or acceptable are performed using lower precision format data.

A determination is then made at 610 whether the neural network is trained. For example, a determination is made whether input values input to the neural network to be trained to generate corresponding output values have iterated (e.g., converged) to the point where the neural network is trained. For example, the computing device runs the neural network on the input values, which are combined to generate corresponding output values. Thus, the output values represent a combination of the input values. In one example, the determination is made as to whether the neural network has been tuned to a level such that the neural network outputs expected values.

If the neural network has not been trained, at 612, the computing device further adjusts the neural network to generate new output values, such as to output similar values to expected values having similar properties (e.g., to converge the output values). For example, the method returns to 604, and in various embodiments, forward pass, back propagation and weight updating are iteratively performed as described herein. Thus, a training loop is performed using the mixed precision calculations.

As should be appreciated, the training process for neural networks generally involves using a training algorithm to update parameters of the neural network in an iterative process, which in various examples is performed at a combination of the lower precision and higher precision. Moreover, the neural network is a collection of nodes interconnected by edges and where there are weights associated with the nodes and/or edges. A linear or non-linear function can be applied in each node to produce an activation thereof. During one or more of the training phases or stages by the method 600, the weights are updated according to update rules in the light of training examples and this process is performed using the higher precision format. Thus, in one example, the neural network is adjusted to cause the change in the output values by changing the weights used by the neural network using higher precision calculations. In some examples, one or more of the nodes in the neural network is modified to slightly change the way the neural network operates. Thus, the outputs themselves are not directly changed, but indirectly changed by changing how the nodes operate to generate the outputs.

With the trained neural network (i.e., a determination is made at 610 that the neural network is trained), the computing device is able to use the neural network to perform neural network operations at 614. For example, a trained neural network model is used by user devices to perform different functions, such as image processing functions.

Thus, in some examples, the method 600 performs neural network training using mixed precision calculations.

Exemplary Operating Environment

Figure 7:
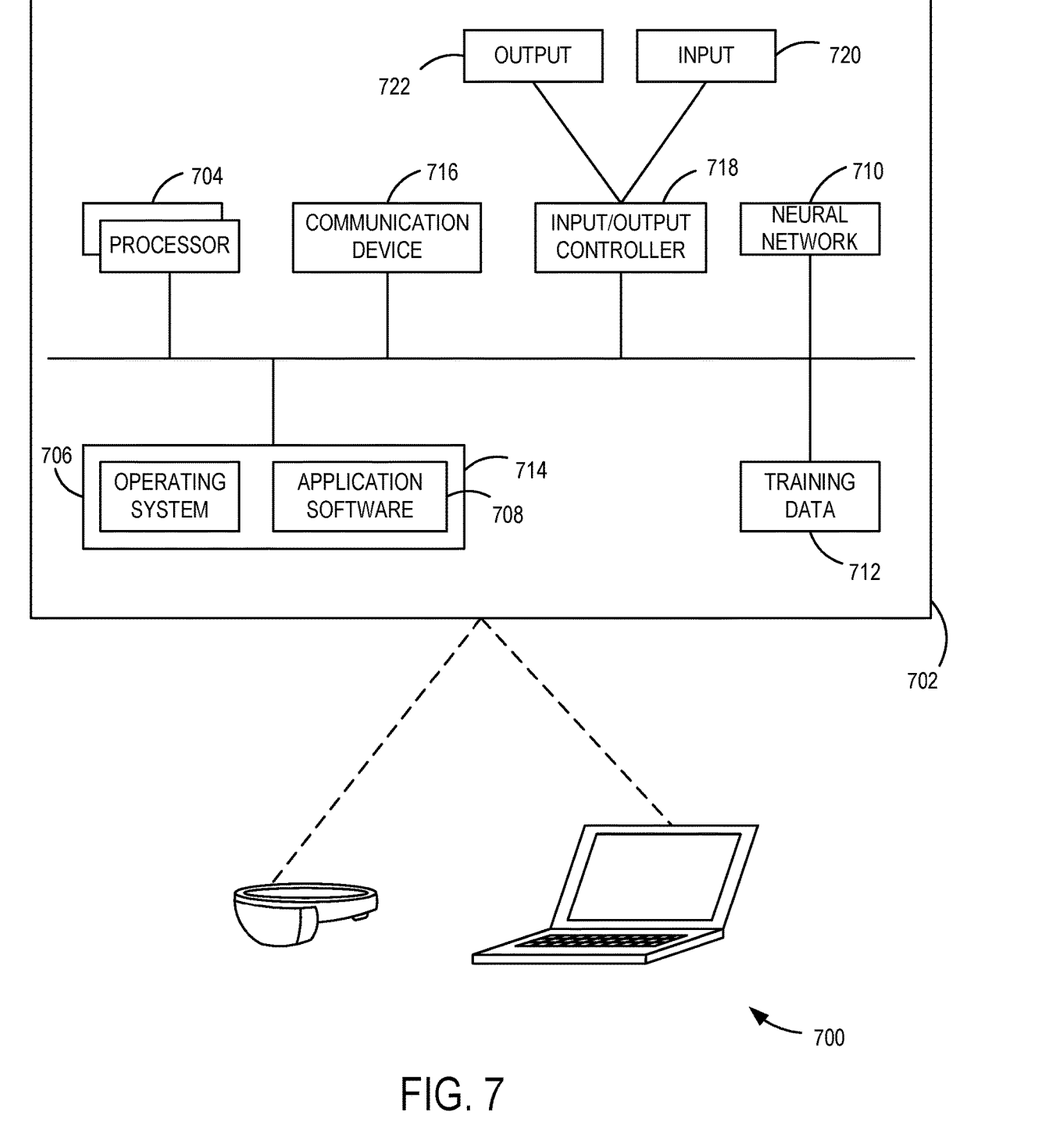
FIG. 7 illustrates a computing apparatus according to an embodiment as a functional block diagram.

The present disclosure is operable with a computing apparatus 702 according to an embodiment as a functional block diagram 700 in FIG. 7. In one example, components of the computing apparatus 702 may be implemented as a part of an electronic device according to one or more embodiments described in this specification. The computing apparatus 702 comprises one or more processors 704 which may be microprocessors, controllers or any other suitable type of processors for processing computer executable instructions to control the operation of the electronic device. Platform software comprising an operating system 706 or any other suitable platform software may be provided on the apparatus 702 to enable application software 708 to be executed on the device. According to an embodiment, training of a neural network 710 using training data 712 and performing mixed precision calculations may be accomplished by software.

Computer executable instructions may be provided using any computer-readable media that are accessible by the computing apparatus 702. Computer-readable media may include, for example, computer storage media such as a memory 714 and communications media. Computer storage media, such as the memory 714, include volatile and non-volatile, removable and non-removable media implemented in any method or technology for storage of information such as computer readable instructions, data structures, program modules or the like. Computer storage media include, but are not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing apparatus. In contrast, communication media may embody computer readable instructions, data structures, program modules, or the like in a modulated data signal, such as a carrier wave, or other transport mechanism. As defined herein, computer storage media do not include communication media. Therefore, a computer storage medium should not be interpreted to be a propagating signal per se. Propagated signals per se are not examples of computer storage media. Although the computer storage medium (the memory 714) is shown within the computing apparatus 702, it will be appreciated by a person skilled in the art, that the storage may be distributed or located remotely and accessed via a network or other communication link (e.g. using a communication interface 716).

The computing apparatus 702 may comprise an input/output controller 718 configured to output information to one or more input devices 720 and output devices 1122, for example a display or a speaker, which may be separate from or integral to the electronic device. The input/output controller 718 may also be configured to receive and process an input from the one or more input devices 720, for example, a keyboard, a microphone or a touchpad. In one embodiment, the output device 722 may also act as the input device 720. An example of such a device may be a touch sensitive display. The input/output controller 718 may also output data to devices other than the output device 722, e.g. a locally connected printing device. In some embodiments, a user may provide input to the input device(s) 720 and/or receive output from the output device(s) 722.

In some examples, the computing apparatus 702 detects voice input, user gestures or other user actions and provides a natural user interface (NUI). This user input may be used to author electronic ink, view content, select ink controls, play videos with electronic ink overlays and for other purposes. The input/output controller 718 outputs data to devices other than a display device in some examples, e.g. a locally connected printing device.

NUI technology enables a user to interact with the computing apparatus 702 in a natural manner, free from artificial constraints imposed by input devices such as mice, keyboards, remote controls and the like. Examples of NUI technology that are provided in some examples include but are not limited to those relying on voice and/or speech recognition, touch and/or stylus recognition (touch sensitive displays), gesture recognition both on screen and adjacent to the screen, air gestures, head and eye tracking, voice and speech, vision, touch, gestures, and machine intelligence. Other examples of NUI technology that are used in some examples include intention and goal understanding systems, motion gesture detection systems using depth cameras (such as stereoscopic camera systems, infrared camera systems, red green blue (rgb) camera systems and combinations of these), motion gesture detection using accelerometers/gyroscopes, facial recognition, three dimensional (3D) displays, head, eye and gaze tracking, immersive augmented reality and virtual reality systems and technologies for sensing brain activity using electric field sensing electrodes (electro encephalogram (EEG) and related methods).

The functionality described herein can be performed, at least in part, by one or more hardware logic components. According to an embodiment, the computing apparatus 702 is configured by the program code when executed by the processor(s) 704 to execute the embodiments of the operations and functionality described. Alternatively, or in addition, the functionality described herein can be performed, at least in part, by one or more hardware logic components. For example, and without limitation, illustrative types of hardware logic components that can be used include FPGAs, ASICs, ASSPs, SOCs, CPLDs, and GPUs.

At least a portion of the functionality of the various elements in the figures may be performed by other elements in the figures, or an entity (e.g., processor, web service, server, application program, computing device, etc.) not shown in the figures.

Although described in connection with an exemplary computing system environment, examples of the disclosure are capable of implementation with numerous other general purpose or special purpose computing system environments, configurations, or devices.

Examples of well-known computing systems, environments, and/or configurations that may be suitable for use with aspects of the disclosure include, but are not limited to, mobile or portable computing devices (e.g., smartphones), personal computers, server computers, hand-held (e.g., tablet) or laptop devices, multiprocessor systems, gaming consoles or controllers, microprocessor-based systems, set top boxes, programmable consumer electronics, mobile telephones, mobile computing and/or communication devices in wearable or accessory form factors (e.g., watches, glasses, headsets, or earphones), network PCs, minicomputers, mainframe computers, distributed computing environments that include any of the above systems or devices, and the like. In general, the disclosure is operable with any device with processing capability such that it can execute instructions such as those described herein. Such systems or devices may accept input from the user in any way, including from input devices such as a keyboard or pointing device, via gesture input, proximity input (such as by hovering), and/or via voice input.

Examples of the disclosure may be described in the general context of computer-executable instructions, such as program modules, executed by one or more computers or other devices in software, firmware, hardware, or a combination thereof. The computer-executable instructions may be organized into one or more computer-executable components or modules. Generally, program modules include, but are not limited to, routines, programs, objects, components, and data structures that perform particular tasks or implement particular abstract data types. Aspects of the disclosure may be implemented with any number and organization of such components or modules. For example, aspects of the disclosure are not limited to the specific computer-executable instructions or the specific components or modules illustrated in the figures and described herein. Other examples of the disclosure may include different computer-executable instructions or components having more or less functionality than illustrated and described herein.

In examples involving a general-purpose computer, aspects of the disclosure transform the general-purpose computer into a special-purpose computing device when configured to execute the instructions described herein.

Alternatively, or in addition to the other examples described herein, examples include any combination of the following:

A system for training a neural network, the system comprising:
  at least one processor; and
  at least one memory comprising computer program code, the at least one memory and the computer program code configured to, with the at least one processor, cause the at least one processor to:
  receive training data;
  perform forward pass and back propagation calculations in a training operation for the neural network using the received training data, the forward pass and back propagation calculations using a first precision and being part of dot product calculations;
  update weights in the neural network as part of the training operation, the weights updated using a second precision, the first precision being less precise than the second precision; and
  modify the neural network with the updated weights.

The system described above, wherein the at least one memory and the computer program code are further configured to, with the at least one processor, cause the at least one processor to calculate an integer gradient value in the forward pass calculations and convert the integer gradient value to a floating point value before performing the updating of the weights, wherein the floating point value is at least a 16-bit value.

The system described above, wherein the calculations at the first precision comprise using block floating point values and the calculations at the second precision comprise using floating point values, and the floating point values comprise at least sixteen bits.

The system described above, wherein the calculations at the first precision comprise using integer values and the calculations at the second precision comprise non-block floating point values.

The system described above, wherein multiplication is performed at the first precision and accumulation is performed at the second precision.

The system described above, wherein the first precision is defined by a first bit format and the second precision is defined by a second bit format, the first bit format being different than the second bit format.

The system described above, further comprising one or more Field-programmable Gate Arrays (FPGAs) and wherein the calculations at the second precision are performed by the one or more FPGAs.

A computerized method for training a neural network, the computerized method comprising:
  receiving training data;
  performing lower precision format training calculations using lower precision format data at one or more training phases;
  converting one or more results from the lower precision format training calculations to higher precision format data;
  performing higher precision format training calculations using the higher precision format data at one or more additional training phases; and
  modifying the neural network using the results from the one or more additional training phases.

The computerized described above, wherein the training phases comprise performing calculations in forward pass, back propagation and weight update training phases, including dot product calculations.

The computerized described above, further comprising calculating an integer gradient value in the forward pass calculations and converting the integer gradient value to a floating point value before performing the updating of the weights, wherein the floating point value is at least a 16-bit value.

The computerized described above, wherein the calculations using the lower precision format data comprise using block floating point values and the calculations using the higher precision format data comprise using single-precision floating point values.

The computerized described above, wherein the single-precision floating point values comprise at least sixteen bits.

The computerized described above, wherein the calculations using the lower precision format data comprise using integer values and the calculations using the higher precision format data comprise using non-block floating point values.

The computerized described above, wherein multiplication is performed using the lower precision format data and accumulation is performed using the higher precision format data.

The computerized described above, wherein the lower precision format data is defined by a first bit format and the higher precision format data is defined by a second bit format, the first bit format being different than the second bit format.

One or more computer storage media having computer-executable instructions for training a neural network that, upon execution by a processor, cause the processor to at least:
  receive training data;
  perform forward pass and back propagation calculations in a training operation for the neural network using the received training data, the forward pass and back propagation calculations using a first precision and being part of dot product calculations;
  update weights in the neural network as part of the training operation, the weights updated using a second precision, the first precision is less precise than the second precision; and
  modify the neural network with the updated weights.

The one or more computer storage media described above having further computer-executable instructions that, upon execution by a processor, cause the processor to at least calculate an integer gradient value in the forward pass calculations and convert the integer gradient value to a floating point value before performing the updating of the weights, wherein the floating point value is at least a 16-bit value.

The one or more computer storage media described above, wherein the calculations at the first precision comprise using block floating point values, the calculations at the second precision comprise using floating point values, and the floating point values comprise at least sixteen bits.

The one or more computer storage media described above, wherein the calculations at the first precision comprise using integer values and the calculations at the second precision comprise non-block floating point values.

The one or more computer storage media described above, wherein multiplication is performed at the first precision and accumulation is performed at the second precision.

Any range or device value given herein may be extended or altered without losing the effect sought, as will be apparent to the skilled person.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The embodiments illustrated and described herein as well as embodiments not specifically described herein but within the scope of aspects of the claims constitute exemplary means for training a neural network. The illustrated one or more processors 704 together with the computer program code stored in memory 714 constitute exemplary processing means for using and/or training neural networks.

The term "comprising" is used in this specification to mean including the feature(s) or act(s) followed thereafter, without excluding the presence of one or more additional features or acts.

In some examples, the operations illustrated in the figures may be implemented as software instructions encoded on a computer readable medium, in hardware programmed or designed to perform the operations, or both. For example, aspects of the disclosure may be implemented as a system on a chip or other circuitry including a plurality of interconnected, electrically conductive elements.

The order of execution or performance of the operations in examples of the disclosure illustrated and described herein is not essential, unless otherwise specified. That is, the operations may be performed in any order, unless otherwise specified, and examples of the disclosure may include additional or fewer operations than those disclosed herein. For example, it is contemplated that executing or performing a particular operation before, contemporaneously with, or after another operation is within the scope of aspects of the disclosure.

When introducing elements of aspects of the disclosure or the examples thereof, the articles "a," "an," "the," and "said" are intended to mean that there are one or more of the elements. The terms "comprising," "including," and "having" are intended to be inclusive and mean that there may be additional elements other than the listed elements. The term "exemplary" is intended to mean "an example of." The phrase "one or more of the following: A, B, and C" means "at least one of A and/or at least one of B and/or at least one of C."

Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

What is claimed is:

1. A system comprising:
   processor; and
   memory comprising computer program code, the memory and the computer program code configured to, with the processor, cause the processor to:
   receive training data;
   perform forward pass and back propagation calculations in a training operation for a neural network using the received training data, the forward pass and back propagation calculations being performed using a first precision;
   update weights in the neural network as part of the training operation, wherein a product operation pertaining to the updating of the weights is performed using the first precision and an accumulation operation pertaining to the updating is performed using a second precision, the first precision being less precise than the second precision; and
   modify the neural network with the updated weights.

2. The system of claim 1, wherein the memory and the computer program code are further configured to, with the processor, cause the processor to calculate an integer gradient value in the back propagation calculations and convert the integer gradient value to a floating point value before performing the updating of the weights.

3. The system of claim 1, wherein the calculations at the first precision comprise using block floating point values and the calculations at the second precision comprise using floating point values, and the floating point values comprise at least sixteen bits, wherein the computer program code further causes the processor to determine the first precision and the second precision based on one or more of an amount of the training data, a type of the training data, and the neural network.

4. The system of claim 1, wherein the calculations at the first precision comprise using integer values and the calculations at the second precision comprise using 32-bit floating point values.

5. The system of claim 1, wherein multiplication is performed at the first precision and accumulation is performed at the second precision.

6. The system of claim 1, wherein the first precision is defined by a first bit format and the second precision is defined by a second bit format, the first bit format being different than the second bit format.

7. The system of claim 1, further comprising a Field-programmable Gate (FPGA) and wherein the calculations at the second precision are performed by the FPGA.

8. The system of claim 1, wherein the memory and the computer program code are further configured to, with the processor, cause the processor to convert a result of the product operation into a higher bit precision format before performing the accumulation operation.

9. A computerized method comprising:
   receiving training data;
   performing forward pass and back propagation calculations in a training operation for a neural network using received training data, the forward pass and back propagation calculations being performed using a first precision;
   updating weights in the neural network as part of the training operation, wherein a product operation pertaining to the updating of the weights is performed using the first precision and an accumulation operation pertaining to the updating is performed using a second precision, the first precision being less precise than the second precision; and
   modifying the neural network using the updated weights.

10. The computerized method of claim 9, wherein a first training phase comprises performing back propagation calculations, and a second training phase comprises performing the updating of the weights.

11. The computerized method of claim 9, further comprising calculating an integer gradient value in the back propagation calculations and converting the integer gradient value to a floating point value before performing the updating of the weights.

12. The computerized method of claim 9, wherein the calculations at the first precision use block floating point values and the calculations at the second precision use floating point values, and the floating point values comprise at least sixteen bits, further comprising determining the first precision and the second precision based on one or more of: an amount of the training data, a type of the training data, and the neural network.

13. The computerized method of claim 9, wherein the calculations at the first precision use integer values and the calculations at the second precision use 32-bit floating point values.

14. The computerized method of claim 9, wherein multiplication is performed at the first precision and accumulation is performed at the second precision.

15. The computerized method of claim 9, wherein the first precision is defined by a second bit format, the first bit format being different than the second bit format.

16. A computer storage having computer-executable instructions that, upon execution by a processor, cause the processor to at least:
 receive training data;
 perform forward pass and back propagation calculations in a training operation for a neural network using the received training data, the forward pass and back propagation calculations using a first precision;
 update weights in the neural network as part of the training operation, wherein a product operation pertaining to the updating of the weights is performed using the first precision and an accumulation operation pertaining to the updating is performed using a second precision, the first precision is less precise than the second precision; and
 modify the neural network with the updated weights.

17. The computer storage medium of claim 16 having further computer-executable instructions that, upon execution by the processor, cause the processor to calculate an integer gradient value in the back propagation calculations and convert the integer gradient value to a floating point value before performing the updating of the weights.

18. The computer storage medium of claim 16, wherein the calculations at the first precision comprise using block floating point values, the calculations at the second precision comprise using floating point values, and the floating point values comprise at least sixteen bits, the calculations at the second precision including updating the weights, wherein the computer-executable instructions upon execution further cause the processor to determine the first precision and the second precision based on one or more of an amount of the training data, a type of the training data, and the neural network.

19. The computer storage medium of claim 16, wherein the calculations at the first precision use integer values and the calculations at the second precision use 32-bit floating point values.

20. The computer storage medium of claim 16, wherein multiplication is performed at the first precision and accumulation is performed at the second precision.

* * * * *